United States Patent [19]

Ogiwara

[11] Patent Number: 4,827,284
[45] Date of Patent: May 2, 1989

[54] IMAGE RECORDER WITH A BACK-UP ROLLER PRESSING THE NIP ROLLER INTO ENGAGEMENT

[75] Inventor: Nagao Ogiwara, Kanagawa, Japan

[73] Assignee: Fuji Photo Film Co., Ltd., Kanagawa, Japan

[21] Appl. No.: 130,059

[22] Filed: Dec. 8, 1987

[30] Foreign Application Priority Data

Dec. 8, 1986 [JP] Japan .................. 61-290620

[51] Int. Cl.[4] .................. G01D 9/00; G01D 9/42; B41F 9/00
[52] U.S. Cl. .................. 346/25; 346/108; 346/136; 101/152; 101/153
[58] Field of Search .................. 346/25, 139 R, 136, 346/108; 226/186, 187, 181, 176, 177; 400/636.3; 101/153, 152

[56] References Cited

U.S. PATENT DOCUMENTS

| 3,477,369 | 11/1969 | Adamson | 101/153 |
| 3,610,144 | 10/1971 | Woessner | 101/153 |
| 3,736,869 | 6/1973 | Motter | 101/153 |

*Primary Examiner*—E. A. Goldberg
*Assistant Examiner*—Mark Reinhart
*Attorney, Agent, or Firm*—Sughrue, Mion, Zinn, Macpeak & Seas

[57] ABSTRACT

In an image recording apparatus in which an image optically formed on a photosensitive material is transferred as a visible image onto an image receiving material by pressurization, a back-up roller is employed to press a free nip roller against a fixed nip roller so that the pressure at the nip region of the two nip rollers is made uniform over the entire length thereof. The back-up roller has a width smaller than the width of the free nip roller against which it presses, and the back-up roller presses only against a central portion of the free nip roller.

6 Claims, 2 Drawing Sheets

IMAGE RECORDER WITH A BACK-UP ROLLER PRESSING THE NIP ROLLER INTO ENGAGEMENT

BACKGROUND OF THE INVENTION

The present invention relates to an image recording apparatus in which a recording material is pressurized and conveyed, and more particularly to an image recording apparatus in which a recording material is pressurized with rollers in such a manner that the image is fixed on the image receiving sheet.

An example of an image recording material which requires pressurization is disclosed in Japanese Unexamined Patent Application No. 179836/1982. In this image recording material, synthetic macromolecular resin wall capsules containing a vinyl compound, photopolymerization initiator and color agent precursor are supported on a support. In an image recording method using the image recording material, upon exposure, the microcapsules are hardened according to the image, and the remaining, unhardened microcapsules are broken by the application of pressure thereto so that the coloring agent precursor is discharge to form a colored image.

The method is advantageous in that images high in quality can be readily obtained by dry processing; however, it is disadvantageous in that the image recording material has a much lower photosensitivity than one using a silver halogenide.

The present applicant has disclosed a novel image recording material in Japanese Patent Application No. 117089/1985 which has a sufficiently high photosensitivity and can provide an image of high quality by simple dry processing. The image recording material is formed by coating a support with at least photosensitive silver halogenide, a reducing agent, a polymerizing compound and a color image forming material, wherein at least the polymerizing compound and the color image forming material are photosensitive compounds sealed, in combination, in microcapsules.

An image recording method using this photosensitive material is disclosed in Japanese Patent Application No. 121284/1985, also filed by the present applicant. In such an image recording method, the image recording material is exposed to form a latent image thereon, and the latent image is developed by heating so that the polymerizing compound in the latent image is polymerized to produce a macromolecular compound, thereby to harden the microcapsules. After development, the image recording material is laid on an image receiving material onto which the color image forming material can be transferred. The image recording material and the image receiving material are pressurized so that at least some of the microcapsules in the regions where no latent image is formed are broken. As a result, the color image forming material is transferred to the image receiving material to form a color image thereon.

On the other hand, an automatic image recording apparatus has been proposed in the art in which a latent image formed on photosensitive material as described above is developed by heating, the photosensitive material is laid on the image receiving material, and the photosensitive material and the image receiving material are pressurized so that the image is transferred onto the image receiving material with the desired color density.

In this automatic image recording apparatus, the developed image is transferred from the photosensitive material onto the image receiving material as follows. The photosensitive material and the image receiving material, after being laid one on another, are inserted into a pair of pressurizing nip rollers so that a high pressure of 500 kg/cm$^2$, for instance, is applied thereto from both sides.

However, since the pressurizing nip rollers are supported at their opposite ends, the pressures produced at the two ends of the rollers are higher than that produced at the middle; that is, the pressurizing nip rollers provide different pressures at different positions, with the result that the image is not uniformly transferred onto the image receiving sheet.

The image recording material is pressurized with such rollers for fixing the image not only in the above-described image recording device but also in an electrophotographic device. In the latter case also, the high pressure applied to the image recording material is unavoidably not uniform.

For the purpose of solving the above-described problems, for instance, a skew roller type pressurizing device and a back-up roller type pressurizing device have been proposed in the art. In the skew roller type pressurizing device, a pair of pressurizing nip rollers are arranged in such a manner that they form a relatively small nip so that the pressure applied to the nip region of the two rollers is uniform over the entire length thereof. In the back-up roller type pressurizing device, back-up rollers are arranged on both dies of a pair of pressurizing nip rollers arranged in parallel with each other so that the pressure applied to the nip region of the pressuring nip rollers is made substantially uniform over the entire length thereof.

However, the skew roller type pressurizing device is disadvantageous in that it cannot be used with image recording materials differing in thickness and/or width. Furthermore, when a photosensitive material and an image receiving material stacked together is conveyed while being pressurized, they have a tendency to shift from each other more at the rear end portion than their front end portion because they are conveyed in directions perpendicular to the axes of the respective nip rollers with which they are in contact.

The back-up roller type pressurizing device also suffers from a difficulty in that, as it needs two back-up rollers in addition to the pressurizing nip rollers, the device is unavoidably bulky and increased in weight.

In addition, in both these pressurizing devices, it is essential to precisely adjust the pressures of the pressurizing nip rollers, with the result that the mechanism is intricate and difficult to maintain.

SUMMARY OF THE INVENTION

Accordingly, an object of this invention is to eliminate the above-described difficulties accompanying an image recording apparatus.

More specifically, an object of the invention is to provide an image recording apparatus with a pressure-operated transfer device having a simple construction and in which the pressure at the nip region of a pair of pressuring nip rollers arranged parallel to one another is uniform over the entire length of the nip region, whereby the image is positively transferred.

The foregoing object and other objects of the invention have been achieved by the provision of an image recording apparatus in which a photosensitive material, formed by coating a support with a material which, when pressurized, fixes an image formed thereon by exposure, is stacked on an image receiving material, and the image thus formed is transferred from the photosensitive material onto the image receiving material under pressure, which apparatus, according to the invention, comprises a pressure-operated transfer device including a fixed rotatably supported nip roller, a free nip roller arranged parallel to the fixed nip roller, and a back-up roller for pressing the free nip roller against the fixed nip roller.

In the image recording apparatus, one of the two pressurizing nip rollers is rotatably supported at both ends in such a manner that sideward movement is inhibited while the other pressurizing nip roller is pushed against the one pressurizing nip roller by the back-up roller. That is, the three rollers cause the pressure at the nip region of the pressurizing nip rollers to be uniform over the entire length thereof. Furthermore, the pressure of the pressurizing nip rollers can be changed merely by adjusting the pressure of the back-up roller.

As use herein, the term "photosensitive material" is intended to mean a material with which an image formed by optical exposure is transferred as a visible image onto an image receiving material with an image receiving layer by pressurization.

An example of an appropriate photosensitive material is disclosed in Japanese Unexampled Published Patent Application No. 179836/1982 filed by the present applicant. The photosensitive material is subjected to optical exposure so that the polymerizing compound is hardened in the patterns of the image, and then the photosensitive material is pressurized so that the image is transferred as a visible image onto the image receiving material. More specifically, the photosensitive material is composed of a support layer and synthetic macromolecular resin wall capsules spread on the support layer, which capsules contain a vinyl compound, photopolymerization initiator and coloring agent precursor.

In accordance with the invention, the photosensitive material may be such that, before transferred by pressurization, the image may be preliminarily thermally developed or may be subjected to wet developing. That is, as disclosed by Japanese Patent Application No. 121284/1985 filed by the present applicant, silver halogenide is optically exposed to form an image, and is then subjected to thermal developing while the polymerizing compound is hardened, and thereafter a visible image is obtained by pressurization. The photosensitive material is formed by coating a support at least with a photosensitive silver halogenide, reducing agent, polymerizing compound and color image forming material, wherein at least the polymerizing compound and the color image forming material are sealed, in combination, in microcapsules.

The nature, principle and utility of the invention will become more apparent from the following detailed description when read in conjunction with the accompanying drawings.

DESCRIPTION OF THE PREFERRED EMBODIMENTS

Figure 1:
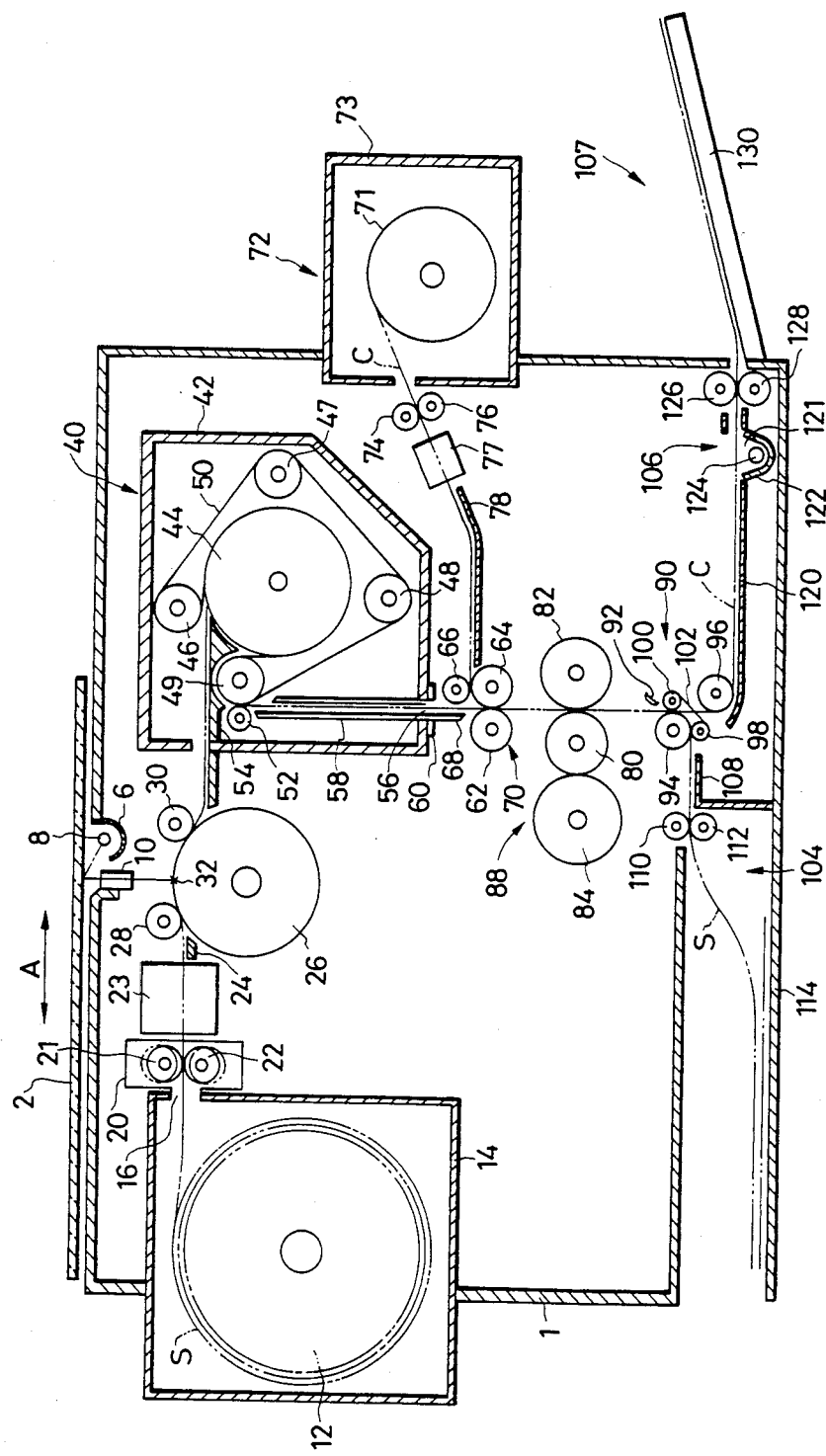
FIG. 1 is a schematic side view showing the arrangement of an example of an image recording apparatus constructed according to the present invention.

A preferred embodiment of an image recording apparatus according to the invention, as shown in FIG. 1, includes a housing and an original-supporting glass plate 2 mounted on the housing and slidably reciprocatable on the upper surface of the housing (as indicated by a double-head arrow A) with the original's surface to be recorded directly downwardly.

A light source 8 with a mirror 6 for illuminating the original is provided below the glass plate 2. A fiber optic lens array 10 for forming the image of the original on a photosensitive material S located at a predetermined position is also provided below the glass plate 2.

A photosensitive material cartridge 14, which accommodates a photosensitive material roll 12 formed by winding photosensitive material S, is detachably mounted on one side of the housing. The cartridge 14 has an outlet 16 for supplying the photosensitive material S. A pair of photosensitive material supply rollers 21 and 22 are provided at the outlet 16 with which the photosensitive material S is fed a predetermined length at a predetermined time, and returned when necessary. The rollers 21 and 22 are mounted in a magazine-connected dark box 20.

When the front end of the photosensitive material S approaches the photosensitive material supply rollers 21 and 22, the latter move away from each other (as indicated by the phantom lines in FIG. 1) to allow the photosensitive material S to move smoothly. A cutting unit 23 for severing lengths of the photosensitive material S and a guide board 24 are provided forwardly of the magazine-connected dark box 20. (The term "forward" as used herein is intended to mean "downstream of the photosensitive material S").

An exposed photosensitive material supporting roller 26 and two photosensitive material nip rollers 28 and 30 pushing against the roller 26 are disposed in front of the guide board 24. Guided by the guide board 24, the photosensitive material S is brought into close contact with the exposed photosensitive material supporting roller 26 by the photosensitive material nip rollers 28 and 30, and the image of the original is optically formed on the photosensitive material S at a predetermined position 32 between the rollers 28 and 30 by means of the fiber optic lens array 10.

A thermal developing unit 40 for thermally developing exposed photosensitive material S is disposed forward of the exposed photosensitive material supporting roller 26. The thermal developing unit 40, as shown in FIG. 1, includes a developing housing 42 acting as a thermal insulator, a heating roller 44 heated to about 120° C., an endless belt 50 supporting by four belt supporting rollers 46, 47, 48 and 49 and wound around the heating roller 44 through an angle of about 270°, and a nip roller 52 pressing against the belt supporting roller 49. The components 44, 46 through 49 and 52 are accommodated inside the housing 42.

The thermal developing unit 40 further includes a guide device 54 for guiding the photosensitive material S supplied from the exposed photosensitive material supporting roller 26 to the heating to the heating roller 44 and for removing the photosensitive material S from the heating roller 44 following thermal development, and a vertical guide device 58 for guiding to an outlet 56 the developed photosensitive material S which has been forwarded by means of the belt supporting roller 49 and the nip roller 52. A photosensitive material front end detecting sensor 60 is provided at the outlet 60.

A photosensitive material and image receiving sheet (image recording sheet) stacking device 70 is provided just below the outlet 56, the device 70 includes a pair of press rollers 62 and 64 pressing against each other, a nip roller 66 pushing against the press roller 64, and a guide member 68 for guiding the photosensitive material S conveyed by the press roller 64 and the nip roller 62 to the nip region of the press rollers 62 and 64.

An image receiving sheet supplying device 72 is disposed beside the photosensitive material and image receiving sheet piling device 70. The device 72 includes an image receiving sheet cartridge 73 with an image receiving sheet roll 71 rotatably supported thereon. The cartridge 73 is detachably mounted on the housing 1. A pair of supply rollers 74 and 76, a cutter unit, and a guide board 78 are provided inside the housing 1 for the cartridge 73 thus mounted.

Provided below the photosensitive material and image receiving sheet piling device 70 is a pressure-operated transfer device 88 which is composed of a free nip roller 80, a fixed nip roller 82, and a back-up roller which has a central axis lying in the same plane as the axis of the free nip roller and which is provided to make the pressure of the fixed nip roller 82 and the free nip roller 80 uniform in the axial direction. The rollers 82 and 80 press against each other under a pressure of about 500 kg/cm$^2$.

A photosensitive material and image receiving sheet separating device 90 is provided below the transfer device 88. The device 90 is composed of a guide member 92, a first conveying roller 94, a second conveying roller 96, and a separating belt 102 laid over guide rollers 98 and 100 in such a manner as to press the photosensitive material S against the first conveying roller 94 only at the two outer ends.

A photosensitive material disposable section 104 is provided on one side of the separating device 90, and a fixing device 106 is provided on the other side. The photosensitive material disposable section 104 is made up of a guide member 108, a pair of conveying rollers 110 and 112, and a disposal box 114. In the section 104, the photosensitive material S delivered from the separating device 90 is guided by the guide member 108 and moved into the disposal box 114 by the rollers 110 and 112.

The fixing device 106 includes a guide member 120 with an irradiation opening 121, an ultraviolet lamp 124 with a reflecting member 122, and a pair of conveying rollers 126 and 128. In the fixing device 106, the image receiving sheet C delivered from the separating device 90 is guided by the guide member 120 and is exposed to ultraviolet rays for about five seconds for fixing.

An image receiving sheet take-out section 107 is provided ahead of the fixing device 106. The section 107 has a take-out tray 130 for receiving the image receiving sheet C connected to the housing 1 in such a manner that it protrudes from the housing 1.

Figure 2:
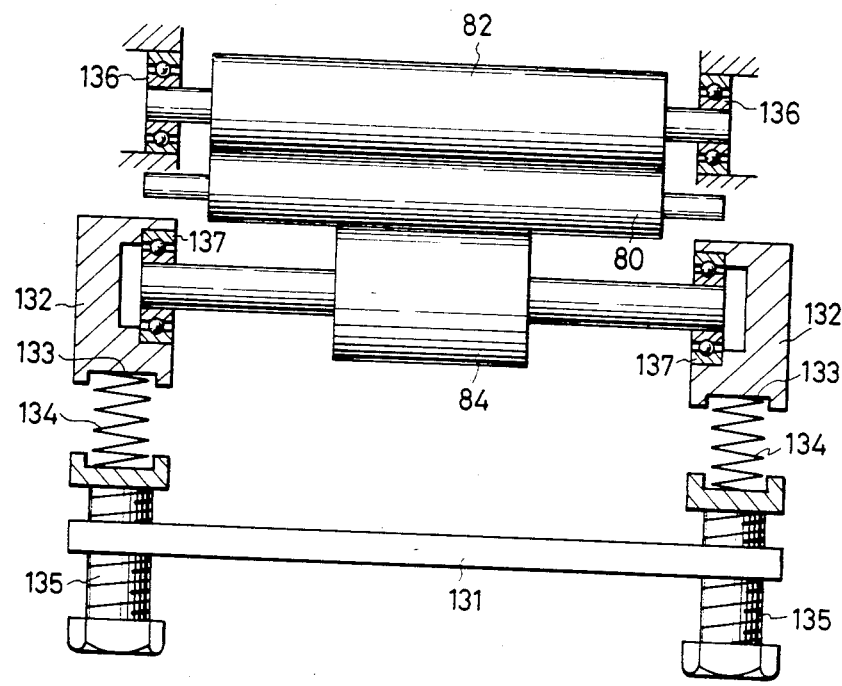
FIG. 2 is a schematic end view showing a pressure-operated transfer device in the image recording apparatus according to the invention.

The pressure-operated transfer device in the image recording apparatus according to the invention will be described with reference to FIG. 2 in more detail.

The fixed (stationary) nip roller 82 is rotatably supported by bearings 136 and 136 at both ends. The free (movable) nip roller 80 is arranged parallel to the fixed nip roller 82 and is smaller in diameter than the fixed nip roller 82. Both ends of the free nip roller 80 are supported in such a manner that they are movable only in a direction perpendicular to the central axis of the fixed nip roller 82. The fixed nip roller 82 (or the free nip roller 80) is rotated by a drive device (not shown) to convey the photosensitive material and the image receiving sheet in cooperation with the free nip roller 80 (or the fixed nip roller 82) under pressure. In this connection, it is preferable to rotate the free nip roller 80 with the drive device because the free nip roller 80 is smaller in diameter than the fixed nip roller 82. More specifically, torque required for conveying the photosensitive material and the image receiving sheet under pressure is smaller than in the case where the fixed nip roller is driven.

As described above, the back-up roller 84 is provided on the side of the free nip roller 80, on the other side of which the fixed nip roller 82 is provided. The roller part of the back-up roller 84 is smaller in length than those of the fixed nip roller 82 and the free nip roller 80, and it is rotatably supported by bearings 132 and 132 at both ends. In the pressure-operated transfer device 88, back-up pressure is applied only from the side of the free nip roller. Therefore, the free nip roller 80 and the fixed nip roller 82 are made different in diameter so that the free nip roller 80 can be readily deformed by the back-up roller 84 while the fixed nip roller 82 is not readily deformed. The reason why the width of the back-up roller 84 is smaller is that, in a pair of rollers arranged parallel to one another, the pressure applied between the rollers is high at both ends of the rollers and low at the middle because they are supported at their ends. The high pressure at the middle of the rollers is compensated for by the back-up roller 84, which is smaller in width than the nip rollers 80 and 82. The bearings 137 and 137 for the back-up roller 84 are fixed with supporting members 132 and 132, respectively. Spring receiving recesses 133 are formed in the supporting members 132 on one side, on the other side with a base 131 fixedly secured to the pressure-operated transfer device.

The back-up roller 84 is urged through the supporting members 132 by the spring members 134 to push against the free nip roller 80. As a resulting, the free nip roller 80 presses against the fixed nip roller 82 with a pressure which is uniform in the axial direction.

When the bolts 135 are turned, the elastic force of the spring members 134 is changed, and accordingly the pressure of the back-up roller 84 is changed, and hence the pressure acting between the fixed nip roller 82 and the free nip roller 80 is changed.

In the above-described embodiment, the spring members 134 and the bolts 135 are employed for adjusting the pressure of the back-up roller 84. However, the invention is not limited thereto or thereby; that is, other pressure adjusting arrangements may be employed.

While an image recording apparatus in which the thermally developed photosensitive material is stacked on the image receiving sheet, and the developed image is transferred from the former onto the latter under pressure has been described, the invention is not limited thereto or thereby. That is, the technical concept of the invention is applicable to devices such as electrophotographic devices in which rollers are employed for fixing images under pressure.

As described above, in the image recording apparatus of the invention, a single back-up roller is employed to make uniform the pressure produced at the nip region of a pair of pressurizing nip rollers arranged parallel to one another. This permits miniaturization of the pressure-operated transfer device.

In the pressure-operated transfer device of the invention, the pressure of the pressurizing nip rollers can be changed merely by adjusting the back-up roller. Therefore, the pressure adjusting mechanism is simple in construction, and hence the image recording apparatus of the invention can readily accommodate changes in the thickness or width of the photosensitive material and the image receiving sheet.

Thus, the image recording apparatus according to the invention can readily provide satisfactory prints free from irregular transfer or color shifting due to nonuniform pressure of the nip rollers.

What is claimed is:

1. An image recording apparatus in which a photosensitive material, formed by coating a support with a material which when pressurized fixes an image formed thereon by exposure, is stacked on an image receiving material, and the image thus formed is transferred from the photosensitive material onto the image receiving material under pressure, said image recording apparatus having a pressure-operated transfer device comprising:

a rotatably supported fixed nip roller extending in a longitudinal direction;

a rotatably supported free nip roller arranged parallel to said fixed nip roller and translatably moveable in a lateral direction perpendicular to said longitudinal direction, said photosensitive material and said image receiving material being disposed between said fixed nip roller and said free nip roller; and a rotatably supported back-up roller arranged parallel to said nip rollers and spring biased in said lateral direction so as to translate said free nip roller toward said fixed nip roller to exert uniform pressure thereagainst, wherein said image is uniformly transferred from said photosensitive material to said image receiving material.

2. The apparatus as claimed in claim 1, in which an effective back-up width of said back-up roller is smaller than a width of said free nip roller.

3. The apparatus as claimed in claim 2, wherein said back-up roller is disposed to press against a center portion of said free nip roller.

4. The apparatus as claimed in claim 2, further comprising means for adjusting a pressure of said back-up roller against said free nip roller.

5. The apparatus as claimed in claim 4, wherein the pressure of said back-up roller against said free nip roller is set so that a pressure between said fixed nip roller and said free nip roller is substantially uniform along the length of a nip region between said free nip roller and said fixed nip roller.

6. The apparatus as claimed in claim 4, wherein said means for adjusting said pressure of said back-up roller against said free nip roller comprises a pair of compression springs, first ends of said springs pressing against respective end portions of said back-up rollers, and a pair of adjustable bolts, second ends of said springs pressing against ends of respective ones of said adjustable bolts.

* * * * *